United States Patent [19]

Koslar

[11] 4,301,407
[45] Nov. 17, 1981

[54] HAND HELD TESTING DEVICE FOR INDICATING AN ELECTRIC TEST VOLTAGE

[75] Inventor: Manfred Koslar, Rheda-Wiedenbrueck, Fed. Rep. of Germany

[73] Assignee: Siemens Aktiengesellschaft, Berlin and Munich, Fed. Rep. of Germany

[21] Appl. No.: 87,035

[22] Filed: Oct. 22, 1979

[30] Foreign Application Priority Data

Oct. 26, 1978 [DE] Fed. Rep. of Germany ....... 2846675

[51] Int. Cl.³ .................. G01R 13/02; G01R 19/16
[52] U.S. Cl. ................. 324/96; 324/103 P; 324/122
[58] Field of Search ............... 324/103 P, 96, 122

[56] References Cited

U.S. PATENT DOCUMENTS

| | | | |
|---|---|---|---|
| 3,555,420 | 1/1971 | Schwartz | 324/149 |
| 3,818,495 | 6/1974 | Sagara et al. | 324/96 |
| 4,004,220 | 1/1977 | Kerber et al. | 324/96 |
| 4,006,412 | 2/1977 | Campbell et al. | 324/96 |
| 4,017,796 | 4/1977 | Tobias | 324/122 |
| 4,027,236 | 5/1977 | Stewart | 324/133 |
| 4,206,404 | 6/1980 | DuBois | 324/96 |

FOREIGN PATENT DOCUMENTS

| | | |
|---|---|---|
| 2060884 | 6/1972 | Fed. Rep. of Germany . |
| 2233765 | 1/1974 | Fed. Rep. of Germany . |
| 2503440 | 7/1975 | Fed. Rep. of Germany . |
| 2503855 | 8/1975 | Fed. Rep. of Germany . |
| 2717826 | 9/1978 | Fed. Rep. of Germany . |
| 1342859 | 1/1974 | United Kingdom . |

OTHER PUBLICATIONS

"Car Ammeter", Elektor, vol. 4, No. 7 & 8, 1978, p. 79.
Snyder, R. A., "Simple Polarity . . . ", Electronic Design News, vol. 22, Nov. 5, 1977, p. 110.

Primary Examiner—Ernest F. Karlsen
Attorney, Agent, or Firm—Spellman, Joel & Pelton

[57] ABSTRACT

There is disclosed a hand-held testing device for indicating different values of an electric test voltage. The testing device comprises at least one grip body adapted to be held in the hand and an electric circuit arranged therein. The grip body has a testing tip forming an input connecting point of the electric circuit adapted for receiving a test voltage and has a ground connection. The voltage divider connected between the connecting point and the ground connection has at least two ohmic resistors connected in series via a respective connector tap. Furthermore, the electric circuit has a plurality of display stages, each stage being connected to a respective connector tap of the voltage divider. Each display stage has a two-state amplifying element responsive to the voltage at the respective connector tap and has an optical display element indicating the presence of a given test voltage which is received at the connecting point. The display stages are interconnected by the outputs of the amplifying elements, such that only the amplifying element of the display stage which corresponds to the value of the given test voltage is switched on.

15 Claims, 6 Drawing Figures

4,301,407

HAND HELD TESTING DEVICE FOR INDICATING AN ELECTRIC TEST VOLTAGE

BACKGROUND OF THE INVENTION

The present invention is directed to a hand-held testing device for indicating different values of an electric test voltage.

Hand-held testing devices are well known in the art and frequently used to display the status of voltages with different applications. One of these testing devices is known from the German Pat. No. 20 60 884. This known testing device is adapted for indicating either the polarity or the phase of an electric voltage relative to a given reference voltage. It has a grip body with a connecting point to receive the test voltage. This connecting point is connected by means of a current limiting resistor to a network of two light emitting diodes arranged in anti-parallel. The antiparallel connection of light emitting diodes is, in turn, connected to a cable forming, for example, a connection to ground or another connecting point for receiving the test voltage. When a direct current (d-c) voltage is tested just one of the light emitting diodes is switched into operable condition and is illuminated. When one of the light emitting diodes is illuminated depends upon the polarity of the test voltage which is received at the connecting point. If an alternating current (a-c) voltage is tested, both light emitting diodes are illuminated.

The current limiting resistor of the electric circuit may be designed as a ceramic PTC resistor. This known type of resistor consists of ferroelectric material on a substrate of n$^-$ and/or p$^-$ doped barium titanate and has, in the range of the Curie temperature, a sudden increase of its electric resistance by a factor or 30 or more. If such a ceramic resistor is used with the testing device, test voltages of about 2 V up to 500 V can be analyzed. In the known testing device, the ceramic resistor performs a protective function for the display elements, as it limits the current by self-heating beyond the Curie temperature.

Another testing device is known from the German Auslegeschrift No. 27 17 826. This known testing device has two grip bodies connected by a cable, each grip body comprises a testing tip and parts of an electric circuit. This testing device is adapted for indicating an electric voltage and/or its polarity or the condition of conductivity of an electric conductor. One of the grip bodies contains a battery and a protective diode connected therewith in series. The ends of this series connection are connected to respective connectors of a double throw switch which is designed as a push-button switch. As one of the input connecting points is also directly connected to one of the connectors of the double throw switch, this switch bridges the battery and the protective diode in one position, which is defined to be the inoperative position. This circuit arrangement of a push-button switch, a battery and a protective diode is in turn, connected via an antiparallel connection of two light emitting diodes and a current limiting resistor to the second input connecting point.

This construction of the known testing device is useful for a variety of applications in practice. The testing device may analyze the presence of an electric voltage and its polarity and may analyze the condition of an electric conductor for passing a current. However, this testing device has no feature to obtain a measurement of the value of the received test voltage.

On the other hand, there is a need to obtain, when testing for the presence of an electric voltage, also approximate information about the value of the test voltage. At high voltages often it is reasonable to separate, whether the value of the test voltage is 100 V, 220 V or 380 V. Also, there are many applications within a lower range of voltage where it is useful to know whether the voltage is, for example, 3 V, 6 V, 12 V or 24 V. While there are a variety of devices for these devices for these purposes with which the exact value of the voltage can be measured, the circuitry of such instruments is expensive and, therefore, the prices of these measuring devices are high. However, in many cases of voltage testing, it is not necessary to obtain an exact value of the voltage, because in a majority of testing situations it has just to be decided whether a minimum voltage is exceeded.

Additionally, from the German Offenlegungsschrift No. 25 03 855 it is known to provide an electric circuit arrangement forming a display section by means of a series connection of light emitting diodes. However, this known circuit arrangement has not been used in reference to a hand-held testing device as described hereinbefore. This circuit arrangement is known in reference to monitoring or supervising desks of TV or record studio facilities. In this circuit arrangement, each of the light emitting diodes are connected in series to a circuit which is supplied by a constant current source. Each of the light emitting diodes is connected in parallel to the emitter-collector-path of respective transistors which control the operable condition of the associated light emitting diode. For the aforementioned purpose series connections of a multiplicity of light emitting diodes are often used where the number of light emitting diodes in operable condition increases linearly with the low value of the voltage to be indicated. Therefore, the bases of the switching transistors are connected to the outputs of respective operational amplifiers. Each operational amplifier is connected by its non-inverting input to a connector tap of a voltage divider. Inverting inputs of the operational amplifiers commonly receive the test voltage to be displayed.

This circuit arrangement gives a satisfactory control of the light emitting diodes. This is essential as these display elements are very sensitive to excessive voltages. This is obtained from the control of the current which passes through all light emitting diodes in the operable condition, which current is limited to the minimum value necessary for the operation of the diode. The circuit arrangement is such that this feature is to be obtained, regardless of the sequence and number in which the light emitting diodes are switched on. The current control circuit consists of another transistor which is connected in series by its collector-emitter-path to the parallel series connections of the light emitting diodes and the amplifying transistors. The emitter is connected to an emitter resistor, while the base of the transistor is connected to an adjustable tap of a voltage divider, which is served by a supply voltage. The circuit of display stages with the series connections of the light emitting diodes and the amplifying transistors further includes a zener diode, which is to ensure reliable switching of the amplifying transistors.

This well-known circuit arrangement has been used up to now, as previously mentioned, only in reference to monitoring desks. This specific application has specific requirements. Above all there are used long chains of display stages which are switched one after another into an operable condition with increasing test voltage. This specific use of the known circuit arrangement in measuring instruments of high reliability has no relation to a hand-held testing device where the application requirements are totally different.

SUMMARY OF THE INVENTION

It is, therefore, an object of the present invention to provide an improved hand-held testing device for indicating different values of an electric test voltage and, in case of a d-c test voltage, the polarity thereof.

It is another object of the invention to provide a hand-held testing device as above by a simple circuitry, which is constructed from inexpensive components and which, nevertheless, meets the technical requirements noted above.

It is another object of the invention to provide a hand-held testing device which is to be as easy to handle as the aforementioned known testing equipment and which is operational over a wide voltage range without change of wiring.

It is another object of the invention to provide a hand-held testing device, as explained above, with an electric circuit arrangement which comprises a voltage divider for receiving the test voltage and a plurality of display stages with display elements, whereby the current supply for the display stages may not flow through the voltage divider.

It is another object of the present invention to provide a hand-held testing device as above with an electric circuit arrangement which current consumption is as low as possible, such that an exchangeable battery may be used as separate voltage supply.

In the present invention a hand-held testing device for indicating different values of electric test voltage has at least one grip body adapted to be held in the hand. In this grip body an electric circuit is arranged which has an input connecting point for receiving a test voltage and which has a ground connection. A voltage divider connected between the connecting point and the ground connection is composed of a plurality of ohmic resistors connected in series and has a connector tap connecting each two adjacent ones of the resistors. There is provided a plurality of display states, each stage includes a non-linear operating differential amplifying circuit and a diode is associated with a respective one of the connector taps and indicates the presence of a given value of said test voltage applied to said connecting point. Each of the amplifying circuits has a control input connected to a respective one of the connector taps of the voltage divider, a voltage supply input and an output. The diodes of said plurality of said display stages are arranged in series such that each diode except for the one forming the last diode of the series connection is connected between the output of respective ones of two adjacent amplifying circuits. The operation of adjacent display stages is such that only one of said amplifying circuit is switched on at a time under control of a respective threshold of a present test voltage. A voltage supply having an output of one polarity commonly connected to said voltage supply input of said amplifying circuits and a pole of opposite polarity connected to said last diode of said series connection of said diodes.

This circuit arrangement is constructed such that just one amplifying element may be operable while all other amplifying elements are cut off. As the current which is necessary for the supply of the display elements has a circuit separated from the voltage divider which received the test voltage, this voltage divider is not affected by the current supply of the display stages. Furthermore, the current may be limited to the minimum value which is necessary to keep the display elements operable regardless of the number of display elements in operable condition.

BRIEF DESCRIPTION OF THE DRAWINGS

A better understanding of the invention may be had by reference to the following description of preferred embodiments in conjunction with the accompanying drawings, in which.

DESCRIPTION OF THE PREFERRED EMBODIMENTS

Preferred embodiments of the invention will now be described in detail with reference to FIGS. 1-6.

Figure 1:
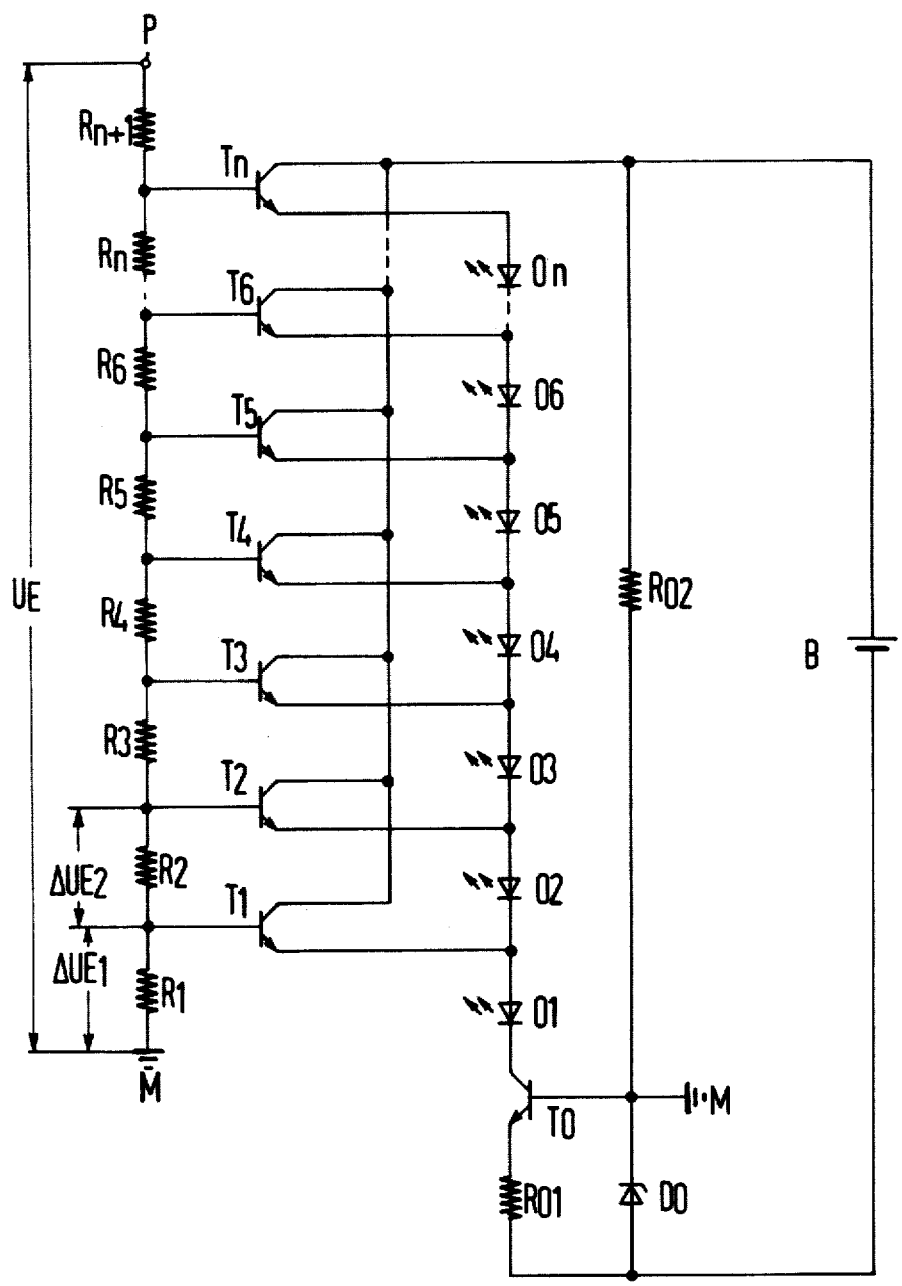
FIG. 1 is a diagram of a basic electronic circuit arrangement for additively displaying of rising ranges of voltages to be indicated by a chain of display elements which are controlled by amplifying transistors stages.

The main features of a hand-held voltage testing device may be obtained from the electrical diagram in FIG. 1. A test voltage $U_E$ to be measured is applied to a voltage divider comprising resistors R1 to Rn+1 connected in series via connector taps between points P and M. The input connector point P represents a testing tip of the hand held testing device. If this device is designed as a single grip body the second input connector M may be a reference point, which is touched by a finger of a testing person. In this case a testing current of a very small amount passes through the human body to ground. However, if the testing device is of a 2-pole type the second input connector point M may represent a testing tip of a second grip body which is connected with the first grip body by a cable.

Each of the various connecting taps of the voltage divider between any pair of resistors R1 and R2, R2 and R3, Rn and Rn & 1 is coupled to the base of one transistor T1, T2 or Tn, respectively. These npn-type transistors T1-Tn form cut-off amplifying stages. The emitter of each transistor T1-Tn is connected to an anode of a respective display element O1, O2, . . . On. These display elements O1-On, in turn, are connected in series and are preferably designed as light emitting diodes (LED'S). The circuit design is such that the amplifying transistors T1-Tn, which are mutually stackered, act as non-linear differential amplifiers. The emitters of each of these transistors are connected with one of the non-linear display elements O1-On while its collectors are commonly connected and applied to a voltage supply. In this embodiment, this voltage supply consists of a battery B with its positive pole connected to the collectors of the transistors T1-Tn. Furthermore, the current supply for the display elements O1-On is controlled and limited by a constant-current source comprising a transistor TO. The collector of this transistor TO is connected to the cathode of the display element of the lower most display stage. The base of the transistor TO is connected to ground and, furthermore, to the cathode of a zener diode DO, which anode is connected to the negative pole of the battery B. The anode of the zener diode DO is furthermore connected to the emitter of the transistor TO via a resistor Ro1. As the zener diode DO is connected across another resistor Ro2 to the positive pole of the battery B it forms a constant-voltage source for the transistor TO, which passes a constant current through the resistor Ro1.

The circuit according to FIG. 1 operates as follows:

By choice of values of the resistors R1 to Rn of the voltage divider the test voltage UE as applied to the input connector PM is divided into rated partial voltages. Upon increase of the test voltage to a value higher than a first threshold voltage, which may represent a lowest voltage level to be indicated a voltage drop across resistor R1 attains a value UE1 at which the emitter-base voltage of transistor T1 and the forward voltage of diode O1 is reached. If the voltage drop exceeds this threshold voltage, the transistor T1 is switched on, its emitter current being determined by transistor TO of the constant-current source. If the test voltage UE increases further, e.g. to a second voltage level to be displayed, then a voltage drop UE2 across resistor R2 becomes equal to the forward voltage of diode O2. This switches the transistor T2 to the conducting state.

As the emitters of the transistors T1-Tn constitute the voltage source for all display elements O1-On, the potential between the diodes O1 and O2 is now determined by the emitter of transistor T2. Thus transistor T1 is going to be blocked since the potential between the diodes O1 and O2 increases faster than the base potential at transistor T1. As transistor T2 absorbs the current limited by transistor TO of the constant-current source, the current through the first amplifying transistor T1 decreases until it is cut off.

The resistors R1-Rn may be linearly rated so that on reaching a respective step voltage the voltage drops across the various resistors R1-Rn correspond to the forward voltage at one of the diodes O1-On. According to this principle already described, only one of the amplifying transistors T1-Tn is switched on at a time, namely the one which corresponds to the respective level of step voltage of the test voltage. On the other hand, as the display elements O1-On are connected in series, they are switched on additively, e.g. three or more display elements may be glowing if the voltage drops across the resistors of the voltage divider reach a respective threshold voltage. This operation produces the advantage that always the same display current is taken from the current source, since the current supply transistor To always delivers just the constant current IO which is determined by the zener diode DO less the emitter-base-potential of transistor TO, divided by the load resistor RO1.

Figure 2:
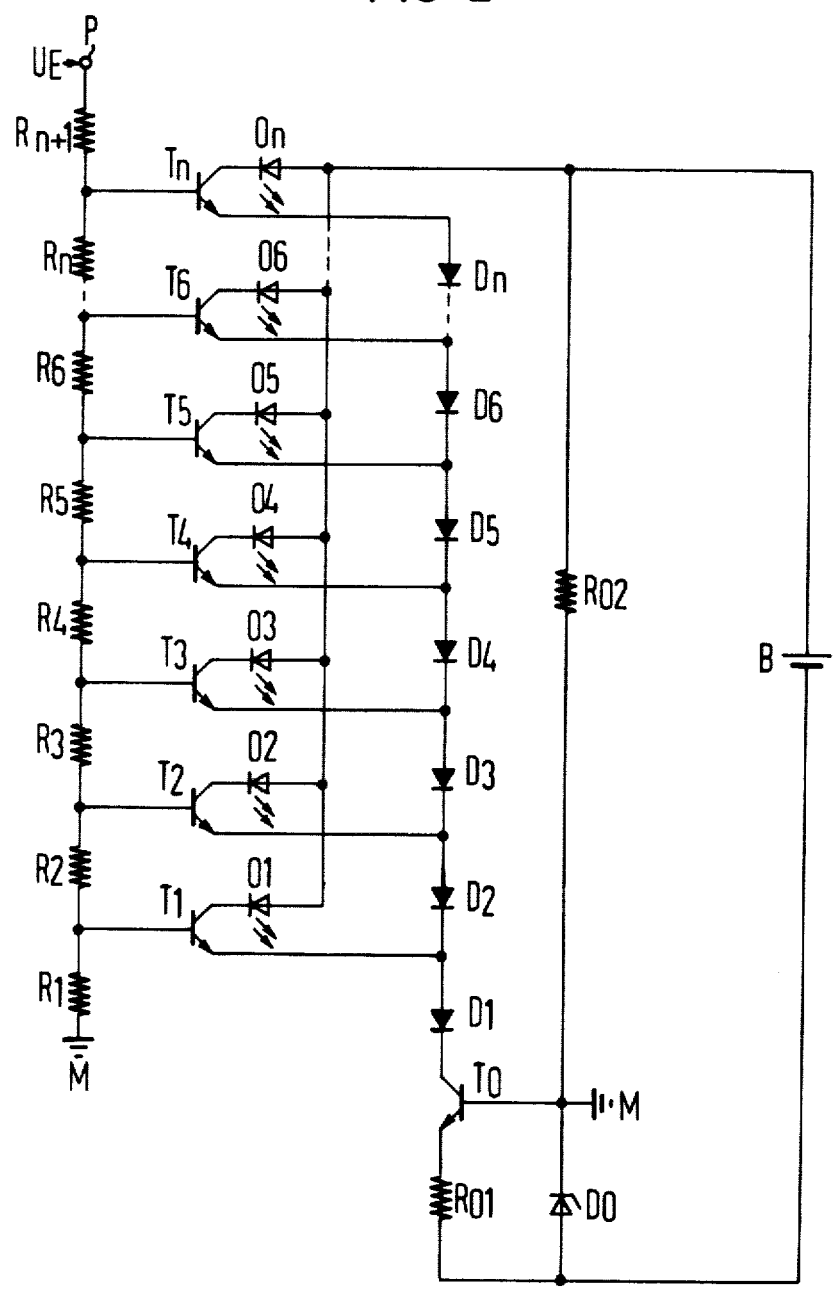
FIG. 2 is a diagram of an alternative basic circuit arrangement indicating the presence of a predetermined value of a voltage to be tested by just one of the display elements.

Another embodiment of the invention is a circuit arrangement which is shown in the circuit diagram of FIG. 2. Elements of this circuit arrangement which are equivalent to elements of the circuit arrangement in FIG. 1 are designated with the same reference symbols. Different to the embodiment of FIG. 1 arrangement and connection of the display elements O1-On. In the circuit arrangement of FIG. 2 the display elements are connected directly to the collectors of the respective amplifying transistors T1-Tn. The collector paths of these transistors are commonly connected to the positive pole of the battery B. In the emitter paths the display elements are replaced by semiconductor diodes D1-Dn. Besides a different working condition of the display elements this circuit operates equivalent to the embodiment already described, as the semiconductor diodes D1-Dn have the same function as the replaced display elements with respect to the switching of the amplifying transistors. However, as the display elements O1-On are inserted into the collector paths of the respective amplifying transistors T1-Tn, they have a different working condition. Since just one of the amplifying stages, according to the level of the applied test voltage UE may be in working condition, no more than one of the display elements, i.e. the display element in the collector path of the operable amplifying transistor is caused to glow while are all other display elements remain extinguished.

Further description of the circuit diagram in FIG. 2 is deemed to be not necessary, since all of the other features, such as a constant-current source, a voltage divider and their mode of operations have been already described in connection with the circuit arrangement of FIG. 1. In the circuit arrangement of FIG. 2 semiconductor diodes D1-Dn are connected to the emitters of the amplifying transistors T1-Tn. It is evident that the emitters of these amplifying transistors T1-Tn also could be coupled directly. In each case, the circuit arrangement of FIG. 2 results in an alternating display device in contrast to the circuit arrangement described hereinbefore in reference to FIG. 1, as, here, just one of the display stages may be in its operative mode.

The resistors R1-Rn may have equal values so that the applied test voltage UE is rated to and displayed in equidistant voltage steps. However, the resistor ratings may be effected in any other desired way, appropriate to the respective requirements. It can be advantageous to chose the voltage steps logarithmically, so as to maintain the error range per step relatively equal. Another main feature of the circuit arrangements of FIG. 1 and FIG. 2 is the separate voltage supply by battery B. This permits the display of relatively low voltages or, alternatively, the use of a high resistance of the circuit arrangement relative to the supplied test voltage. This, of course, allows the test device to be designed as a single-pole instrument with one grip.

Figure 3:
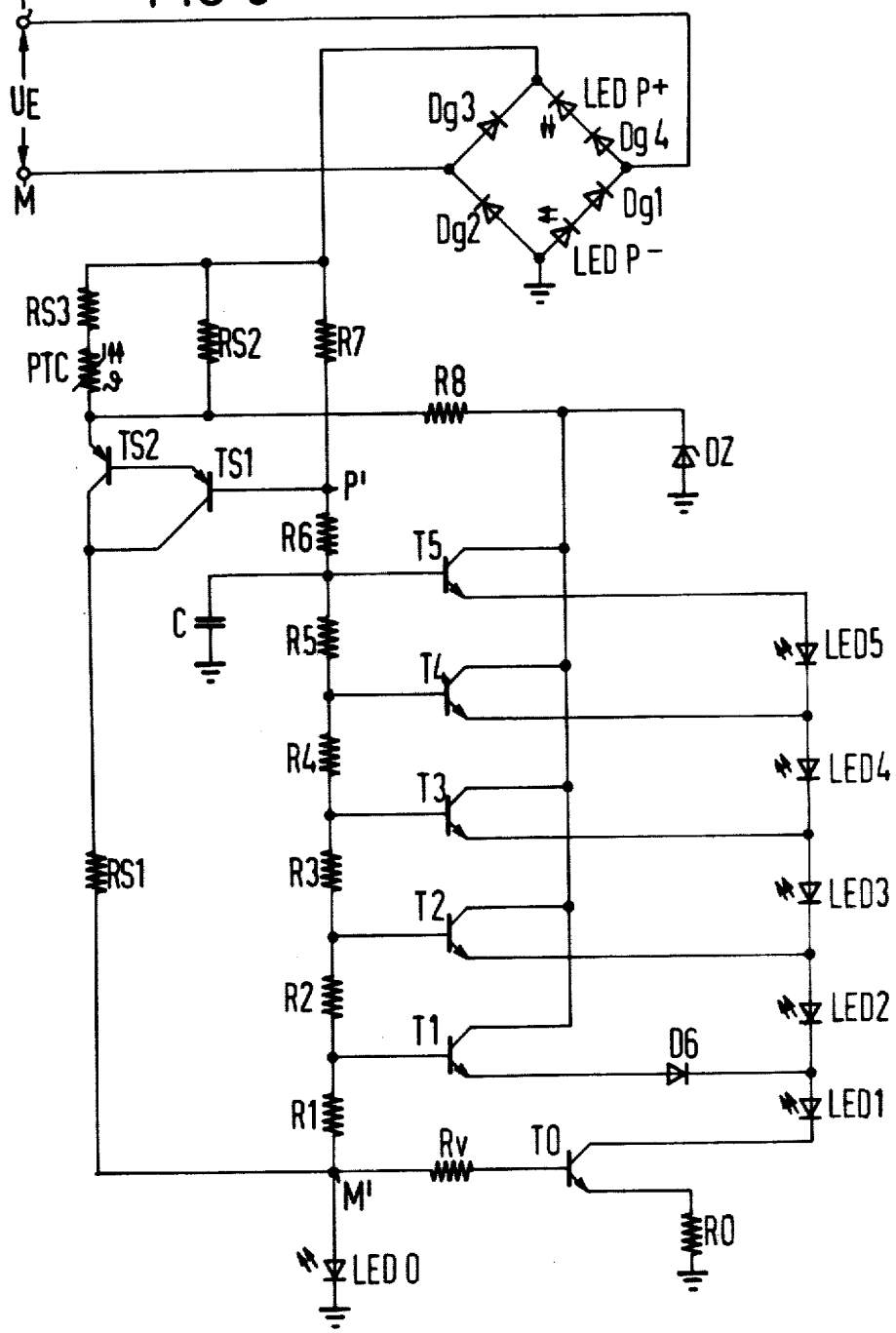
FIG. 3 is a diagram in detail of a preferred embodiment of a testing device for displaying as well different ranges of voltages as the polarity of a voltage.

Starting from the same features another embodiment of the invention may be seen in the circuit diagram of FIG. 3. This circuit arrangement indicates both direct current (d-c) and alternating current (a-c) voltages and different polarity as well. The display elements are preferably light emitting diodes, LED1-LED5. The circuit arrangement is designed as to assign multiple functions to some of these display elements. In this embodiment of the invention the test voltage UE is applied to a rectifying bridge consisting of four bridge diodes Dg1-Dg4. Each bridge branch of this rectifier bridge comprises respective additional light emitting diodes LED P+, LED P−, which, permit displaying the polarity (−) or (+) of a D-C-voltage and an A-C voltage by firing both additional diodes LED P+ and LED P− as well.

In addition, the circuit arrangement of FIG. 3 comprises a display section which has already been described in reference to the circuit arrangements of FIG. 1 or FIG. 2. The circuit comprises a voltage divider of serially connected resistors R1-R7. The free connection lead of the resistor R7 is connected to one center balancing point in one branch of the rectifier bridge, while the second balancing point of this rectifier bridge is grounded. The other end of the voltage divider i.e. the free lead of the first resistor R1 is grounded via another display element LED O. Each connector tap between successive resistors of the voltage divider, e.g. the resistors R1 and R2, is connected to the base of a respective amplifying transistor T1-T5. The emitters of these transistors are coupled to the anodes of respective light emitting diodes LED1-LED5, which are connected in series. The collectors of the amplifying transistors T1-T5 are commonly connected to a common voltage supply.

Furthermore, the second connection lead of the first resistor R1 of the voltage divider at the lower end connecting point M' is connected via a series resistor Rv to the base of another amplifying transistor TO, which collector path is connected to the cathode of the lowest one of display elements (LED1) which are connected in series. The emitter of this amplifying transistor TO is grounded via an emitter-resistor RO. For the current supply of the amplifying transistors T1-T5 there are provided two further transistors TS1 and TS2 in Darlington configuration. The base of the first of the Darlington transistors TS1 is connected to the upper end point P' of the test voltage divider between the resistors R7 and R6. The collectors of both transistors TS1 and TS2 of the Darlington circuit are connected via a common collector resistor RS1 to the lower end connecting point M' of the voltage divider. This Darlington circuit performs a current supply for the amplifying transistors of the display circuit. To protect the Darlington circuit from extremely high test voltages its input, i.e., the emitter of the second transistor TS2 is connected to the ungrounded center tap of the rectifier bridge circuit via a protective circuit.

This protective circuit consists of a series connection of an ohmic resistor RS3 and a ceramic resistor PTC with a positive temperature coefficient. A further ohmic resistor RS2 is connected in parallel to these two resistors PTC and RS3. Furthermore, this resistor network is connected to the collectors of the amplifying resistors T1-T5 via a resistor R8, which, in turn, is connected to ground via a zener diode DZ. The display elements, as already described in reference to other embodiments of the invention are supplied by a constant current source. This source is performed by a further transistor TO which collector-emitter-path is connected to the cathode of the lower most display element LED1 of the display elements connected in series. The emitter is grounded via an emitter resistor R0. The base of the transistor T0 is connected to the lower end connecting point M' of the voltage divider via a base-resistor Rv. As the lower end connecting point M' is grounded via the lower most display element LED 0, this display element forms additionally the constant voltage source of the constant current supply.

This testing circuit arrangement of FIG. 3 operates as follows:

If a test voltage UE is applied to the inputs of the rectifying bridge network, this test voltage is indicated as being a direct current (d-c) or an alternating current (a-c) voltage by means of the display elements LED P+ and LED P−. If the test voltage is a d-c voltage just one of these display elements will be fired depending on the voltage polarity (+) or (−). In case of an a-c test voltage both of the display elements LED P+ and LED P− will be fired.

To analyze the value of an applied test voltage the output signal at the ungrounded center tap of the rectifying bridge is passed to the resistors R1-R7 of the voltage divider. As described in detail in reference to the circuit arrangements in FIGS. 1 and 2 according to the amplitude of this signal one or more or the display elements are fired.

The main difference to the alternative embodiments already described herein before is that the circuit arrangement of FIG. 3 has no separate current supply. For the current supply of the transistors T1-T5 there is provided the Darlington circuit. This circuit is protected from extremely high test voltages by the protective circuit. By the series connection, made up of the ceramic resistor PTC and the ohmic resistor RS3, the current flowing through transistor TS2 of the Darlington circuit is limited at a very high input voltage, since the ceramic resistor PTC heats up while loaded, and its resistance increases correspondingly. And as the potential at the base of the first transistor TS1 of the Darlington circuit increases in direct proportion to the input voltage of the linear voltage divider R1-R7, the emitter of this second transistor TS2 follows the amplitude of the rectifier bridge output signal according to the divider ratio. However, the current flowing through this transistor TS2 of the Darlington circuit is limited, due to limiting function of the ceramic resistor PTC, so that the display element LED 0 of the lowest display stage receives a limited current. At the same time, in order not to exceed the collector-emitter voltage limit of the current source transistor T0, its collector voltage is limited by the zener diode DZ, if the test voltage UE becomes too high. An excessive voltage then drops across resistor R8. Similar protective functions has a further semiconductor diode D6, which is inserted between the collector of the first amplifying transistor T1 and the anode of the first of the display elements LED1 connected in series.

The circuit here illustrated has been realized in a testing device for the voltage steps stated below. For d-c voltage not only the voltage step but also the polarity is displayed, and for a-c voltage both display elements LED P+ and LED P−, intended for polarity display, light up. At a voltage which is or exceeds 6 volts, in the case of a d-c voltage, the display element LED P− lights up, if the testing tip, i.e. connecting point P of the device is applied at the positive pole. If the connecting point P is applied at the negative pole, the other display element LED P− of the rectifying bridge lights up. The same polarity indication occurs also for d-c voltages in the voltage steps starting at 12, 24, 50, 110 and starting at 380 V respectively. At a-c voltage, e.g. at 220 V both display elements LED P+ and LED P− for polarity indication as well as the other display elements LED 0 and LED1-LED4 light up.

The voltage steps are classified as set forth in the following table:

| STEPS OF TEST VOLTAGE UE | ADDITIVE OPERATION OF DISPLAY ELEMENTS |
|---|---|
| 6V | LED P+/LED P− |
| 12V | LED 0 |
| 24V | LED1 |
| 50V | LED2 |
| 110V | LED3 |
| 220V | LED 4 |
| 380V | LED5 |

Additionally, these circuit arrangements may be adjusted to distinct frequency ranges, for example, to the range of 50 to 60 Hz. This can be obtained from an additional capacitor C which is inserted between ground and the connection tap between resistors R6 and R5 of the voltage divider. The capacity may be designed such that the capacitor C and the high resistant resistors R6 and R7 form an integrator, which equates a full wave rectified a-c test voltage with the value of a d-c input voltage for the respective threshold values.

Sometimes it may be of value to have a testing device which is capable as well to analyze low voltages, for example within the range of 3 V to about 50 V as to have a rough analysis of voltages within a higher amplitude range starting from 110 V to about 380 V. A device specifically designed for meeting these requirements is an embodiment of the invention which will now be described in reference to FIG. 4. This circuit arrangement comprises two parts according to the aforementioned requirements. Some components and networks have already been described in reference to the circuit diagrams of FIGS. 1 to 3; therefore, further description only seems to be necessary relating to specific additional features of this embodiment.

For displaying low voltages transistors T0, T1 and T2 and display elements LED1 and LED2 form display stages. They are connected to a voltage divider consisting of three resistors R1, R2 and R3 which are connected in series. Transistors T1 and T2 are performing in connection with the display elements LED1 and LED2, respectively, two display stages as described herein before. The transistor T0 is provided with a grounded emitter resistor R0 and performs a constant current source.

These display stages for low voltages are protected by a protective circuit. This protective circuit comprises of first ceramic resistor PTC1, being connected in parallel with resistor RS1. Both resistors are, as well as resistor R3 of the voltage divider, connected to an ungrounded center tap of a rectifier bridge of four semiconductor diodes Dg1-Dg4. Input taps of the rectifier bridge are connected to the input connecting points P and M, respectively, for receiving the test voltage UE. The two resistors PTC1 and RS1, are commonly connected to the collectors of the two amplifying transistors T1 and T2 as well as to a series connection of a zener diode DZ and two protective semiconductor diodes D1 and D2, which are connected to ground.

The second part of this circuit arrangement comprises of an antiparallel connection of two display elements LED P+ and LED P− which are inserted between the input connecting point P and a series connection of three glow discharge lamps G11, G12 and G13 performing display elements of a display section for higher voltages. The glow discharge lamps are associated with a further voltage divider consisting of three resistors RA1, RA2 and RA3, connected in series. Connector taps of this voltage divider are connected to a respective glow discharge lamp G11-G13 such that the resistors perform in the whole or in part, respectively, load resistances for the glow discharge lamps. Therefore, the lower most resistor RA1 of the voltage divider is connected to the second input of the circuit arrangement, i.e. the connecting point M.

In parallel to this display section for higher voltages, consisting of the glow discharge lamps G11-G13 and the voltage divider with resistors RA1-RA3, a second ceramic resistor PTC2 is arranged. This second ceramic resistor PTC2 precedes the rectifier bridge as a protective element; and it limits the current for the display elements LED P+ and LED P− as the ceramic PTC resistor is connected in series with these antiparallel connected display elements.

The circuit arrangement of FIG. 4 operates as follows:

For lower display steps, e.g. for 6, 12 and 24 volts respectively the display elements, LED P+ and LED P− for polarity indication as well as the display elements LED1 and LED2 are provided. In case of a d-c voltage of about 6V the display element LED P+ glows if the positive polarity of the testing voltage UE is applied to the input connecting point P, otherwise, display element LED P− lights up. At voltages which exceed 12V, additionally the first display element LED1 of the two display stages is operable. If the test voltage exceeds 24V, additionally the display element LED2 lights up. This display section for low voltage steps is protected from excessive voltages by a protective circuit inserted between the rectifier bridge and the display section. This protective circuit is designed as set forth in the aforementioned embodiment in reference to FIG. 3 and operates accordingly.

The second display section is designed for testing of higher a-c voltages and higher amplitudes preferably. In this case, both display elements LED P+ and LED P− are operable. Depending on the value of the test voltage besides the display elements LED1 and LED2, one or more of the glow discharge lamps G11 - G13 will glow, additionally. The voltage divider consisting of the three resistors RA1 - RA3 of the display section for higher voltages is rated such that at a test voltage of more than 110V the first glow discharge lamp G11 glows. At a test voltage of more than 220V, additionally, the second glow discharge lamp G12 and at 380V the third glow discharge lamp G13 light up, too.

The second ceramic resistor PTC2 which is connected in parallel to these three glow discharge lamps G11 - G13 preceeds the rectifier bridge as a protective element and is limiting the current through the antiparallel connected display elements LED P+ and LED P− in case of excessive test voltages.

Figure 5:
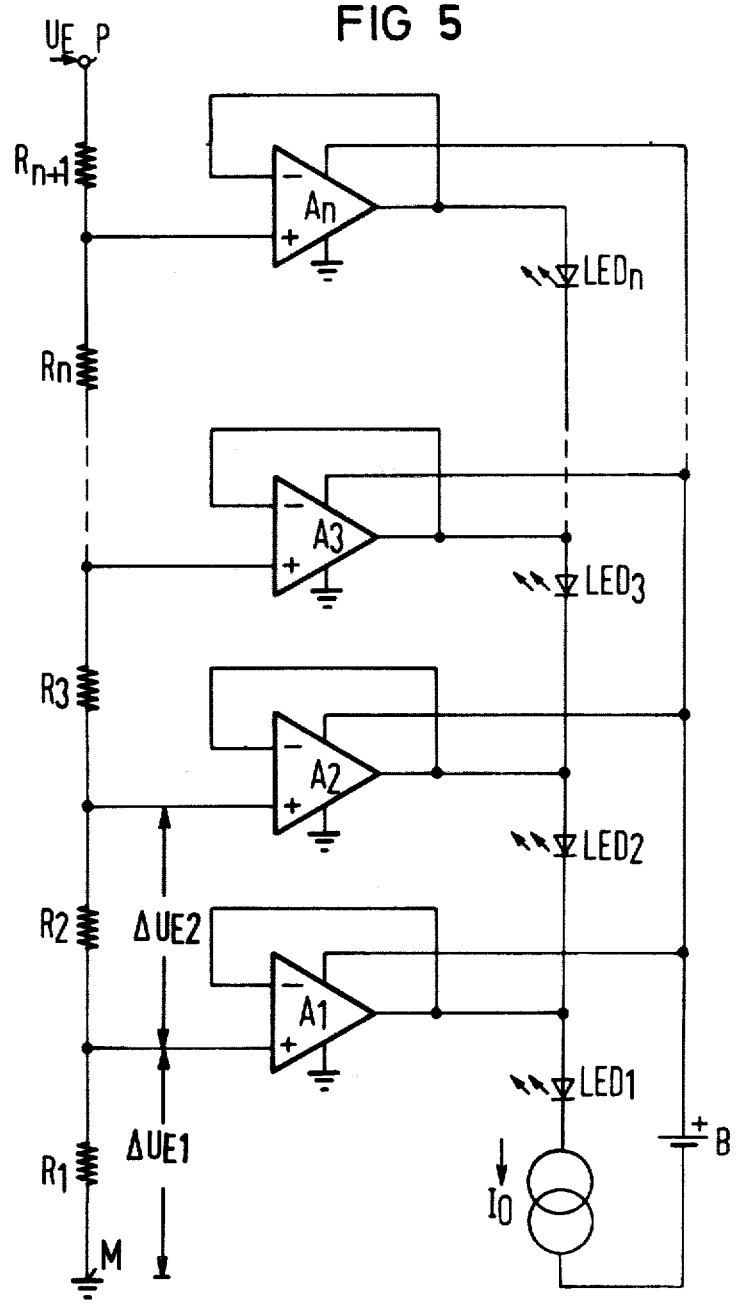
FIG. 5 is an electrical diagram of an alternative circuit arrangement of FIG. 1 wherein instead of transistor stages operational amplifiers are employed.

An alternative circuit arrangement to the embodiment of the invention which has already been described in reference to FIG. 1 is to be obtained from the circuit diagram in FIG. 5. The main difference of this circuit arrangement to the aforementioned embodiment consists of a design with operational amplifiers A1 - An instead of amplifying transistors. Each of the operational amplifiers A1 - An is connected with its non-inverting high-resistance input, marked by "+" to a respective one of the connector taps between the divider resistors R1 - Rn+1. The outputs of these operational amplifiers A1-An, in this embodiment, are shortcircuited with the corresponding inverting input, marked by "—", and hence have a gain of 1.

To the outputs of the operational amplifiers A1 - An display elements LED1 - LEDn are coupled such that the output of each of the operational amplifiers A1 - An is connected to a respective connecting tap between display elements LED1 - LEDn. The display elements LED1 - LEDn and hence the outputs of the amplifiers A1 - An are supplied by a constant-current source IO which is in FIG. 5 represented by its basic circuit diagram and can be realized either by transistors or by operational amplifiers, as well known in the art. In the circuit arrangement in reference to FIG. 5, the operational amplifiers A1 - An are supplied by a battery B.

The circuit arrangement operates as follows:

If a positive test voltage UE is applied to the input connecting point P, as indicated by an arrow, the potential at resistors R1 - Rn+1 of the voltage divider increases with a respective increase of the test voltage. If the proportional voltage drop across resistor R1 reaches such a value that the output voltage of the respective operational amplifier A1 corresponds to the minimum operating or response voltage of the first display element LED1, this display element will be turned into its operable condition. As the increasing voltage drop across the first resistor R1 of the voltage divider reaches a threshold voltage EUE1, which is determined by the size of the voltage divider, the first display element LED1 will light up. At the same time the current fed to this display element increases to the value IO. With further increasing test voltage a voltage drop across the second resistor R2 of the voltage divider, will become sufficient to drive the second display element LED2 operable, as soon as this voltage drop reaches the second threshold value UE2, since the output of the second operational amplifier A2 follows the partial voltage which is fed to its non-inverting input.

The second operational amplifier A2 determines the potential at the second display element LED2 and hence also the potential of the output of the first operational amplifier A1. In turn, the potential at the inverting input of this amplifier is likewise established. The first operational amplifier A1 is going to be switched off and becomes inoperable, as its inverting input, marked by "—" carries a higher potential than its non-inverting input, marked by "+". This, in turn, is obtained from that the voltage drop across the two resistors R1 and R2 of the voltage divider increases with greater variation than the voltage drop across the first resistor R1. Since both operable display elements LED1 and LED2 are connected in series, both elements have the same current and glow with equal brightness. The circuit arrangement of FIG. 5, therefore, is to be understood as an additive display.

By a similar operation the third display stage and further stages are switched on upon further increases of the test voltage UE and respective voltage drops across the resistors of the voltage divider. As soon as the third operational amplifier A3 is operable, because of the increase of the input voltage at its non-inverting input, similarly the second operational amplifier A2 is switched off and the third display element LED3 is additively fired. According to this principle, the display section may be constructed of any number of display stages.

The advantage of this embodiment, above all, is a higher input resistance of the operational amplifier. In comparison to a transistor input resistance the input resistance of an operational amplifier is several tenfolds higher. Consequently the influence of the input current of the operational amplifier with respect to the voltage divider is neglectable. Therefore, the ohmic resistors of the voltage divider can be designed as very high resistances, easily reaching values of several megaohms. If the voltage supply of the circuit arrangement is performed by a battery or another independent voltage source, input resistances are obtained which are customary in high quality measuring instruments and which permit a measuring of the test voltage with neglectible loss of electrical power.

Figure 6:
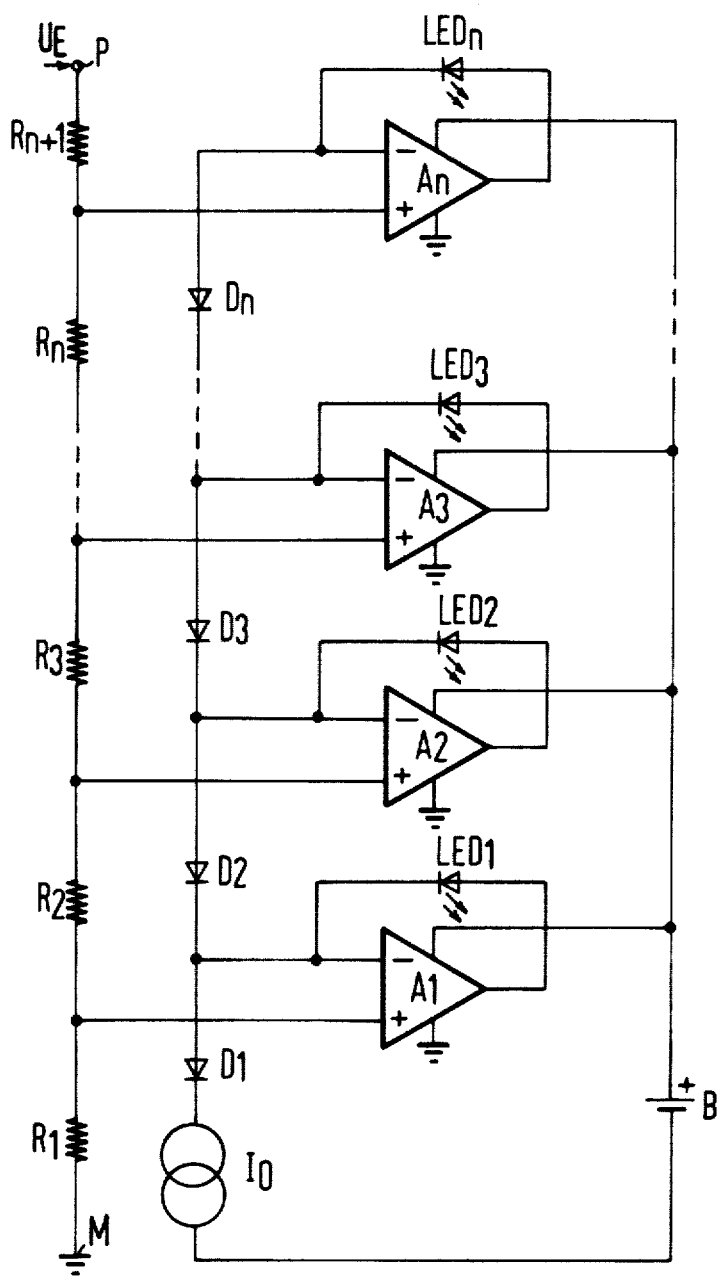
FIG. 6 is an electrical diagram of an alternative circuit arrangement of FIG. 2 with operational amplifiers incorporating amplifying elements.

In reference to FIG. 2 there has been described an embodiment of the invention, where only one of the display elements 01 : On can be operable. This has been understood as an alternating network. An alternative embodiment of the invention with this main feature will be described now in reference to FIG. 6. It is provided with operational amplifiers A1 - An as amplifying stages for respective display elements LED1 - LEDn. Each of these operational amplifiers is connected with its non-inverting input to one respective connector tap between resistors R1 - Rn+1 of the voltage divider, between the input correcting point P and a ground connection. Here now the display elements LED1 through LEDn are inserted into a respective feedback branch of the operational amplifiers A1 - An. This feedback is connected to inverting amplifier inputs, marked by "—" and additionally, to respective connector taps of diodes D1 - Dn connected in series. This series connection of diodes is connected to a constant current source, in FIG. 6 represented by a basic circuit diagram. The operational amplifiers are commonly connected to and supplied by a voltage source, which is designed as a battery B.

A test voltage UE is applied to the input connecting point P of the voltage divider. As soon as it reaches a first step value, the voltage drop across the resistor R1 is high enough as to reach a forward voltage of the first diode D1. Then, the first display element LED1 becomes operable since the output voltage of the operational amplifier A1 is sufficient to overcome the barrier potential of the display element. The current is determined by the constant current source IO. With increasing test voltage UE the different respective step values determined by the voltage divider design are reached. The operable condition of the second display stage is obtained from a voltage drop across resistors R1 and R2 high enough to fire the second display element by the output voltage of the second operational amplifier A2.

If rating of resistor R2 is such that the voltage difference between the values of the first step voltage and the second step voltage produces a voltage drop across the second resistor R2 which corresponds to the forward voltage of the second diode D2, the second display element LED2 is switched on at this value. Since that variation of the potential at the connector tap between the resistors R2 and R3 of the voltage divider is higher than at the respective connector tap between resistors R1 and R2, the potential at the inverting input of the second operational amplifier A2 increases faster than the potential at non-inverting input of the first operational amplifier A1. Since the inverting input of the second operational amplifier A2 is connected with the inverting input of the first operational amplifier A1 via the diode D2, the first operational amplifier A1 is switched off. The principle remains true for all higher stages of the display section, which display elements are stepwise fired and switched off.

Figure 4:
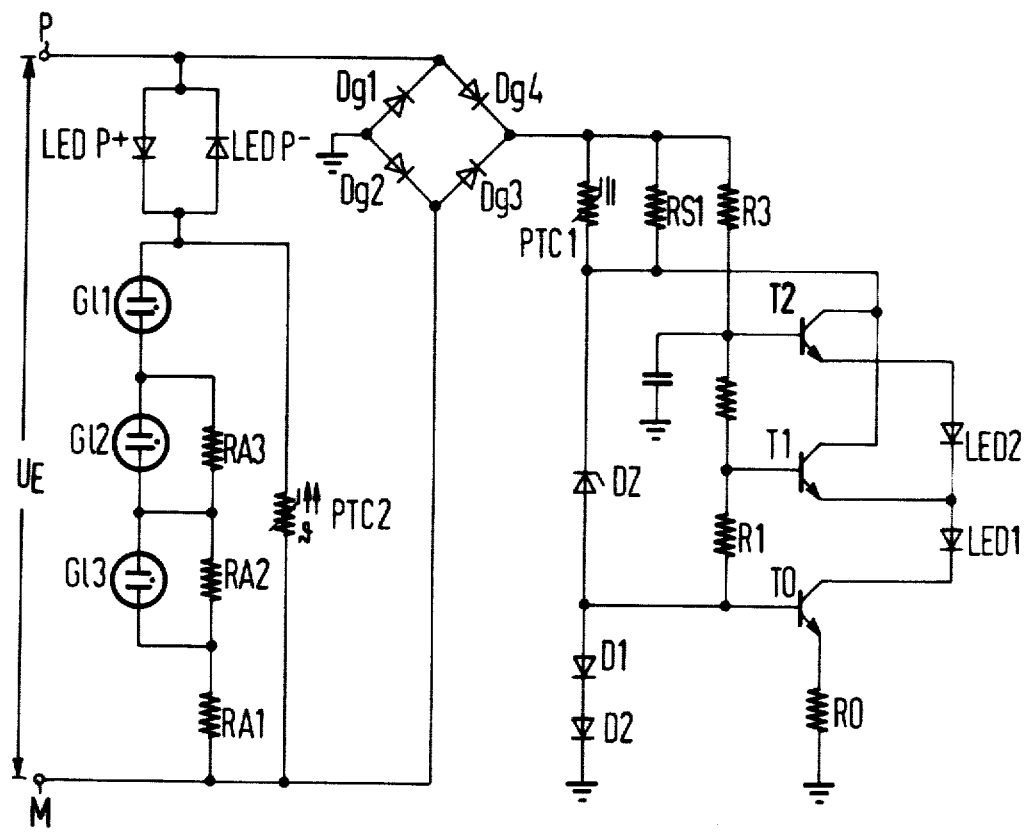
FIG. 4 is another detailed diagram of a testing device with separate display sections for indicating test voltages within a lower voltage range by light emitting diodes and for indicating test voltages within an higher voltage range by glow discharge lamps and further light emitting diodes for displaying the polarity of an applied test voltage.

Obviously, the display stages in the circuit arrangements according to FIGS. 3 and 4 may be similarly constructed with operational amplifiers as shown and described with the circuit arrangements in reference to FIGS. 5 and 6.

In the embodiments described herein before a plurality of display elements is constructed of light emitting diodes. It is to be understood that this element may be replaced by a liquid crystal display element, which is as useful as a light emitting diode, in reference to power consumption, for example. This replacement requires, however, a proper voltage supply constructed of a voltage source producing square wave pulses.

While the circuit arrangements herein described constitute preferred embodiments of the invention, it is to be understood that the invention is not limited to these specific circuit arrangements; and that a variety of changes may be made without departing from the scope of the invention, e.g., it is to be understood that the electric circuit may be designed as an integrated circuit.

I claim:

1. A hand held testing device for indicating different values of an electric test voltage, said device comprising
    (a) at least one grip adapted to be held in the hand; and
    (b) an electric circuit, arranged in said grip body, said circuit including
        (1) a connecting point, adapted for receiving a test voltage;
        (2) a ground connection;
        (3) a voltage divider being composed of a plurality of ohmic resistors connected in series and having a connector tap connecting each two adjacent ones of said resistors; said voltage divider being connected between said connecting point and said ground connection;
        (4) a plurality of display stages, each stage including a non-linear operating differential amplifying circuit and a diode, each stage being associated with a respective one of said connector taps and indicating the presence of a given value of said test voltage applied to said connecting point; each of said amplifying circuits having a control input connected to a respective one of said connector taps of said voltage divider, a voltage supply input and an output; said diodes of said plurality of said display stages being arranged in series such that each diode except for the one forming the last diode of the series connection is connected between the outputs of respective ones of two adjacent amplifying circuits, wherein only one of said amplifying circuits is switched on at a time under control of a respective threshold of a present test voltage; and
        (5) a voltage supply having an output of one polarity commonly connected to said voltage supply inputs of said amplifying circuits and an output of opposite polarity connected to said last diode of said series connection of said diodes.

2. The hand held testing device as recited in claim 1, wherein the amplifying circuits each comprise a transistor having a base forming said control input, a collector forming said voltage supply input and an emitter forming said output of said amplifying circuit.

3. The hand held testing device as recited in claim 1, wherein said diodes are constructed of light emitting diodes each forming simultaneously a display element associated with a respective one of said display stages.

4. The hand held testing device as recited in claim 1, in which the optical display element, being constructed of a light emitting diode is connected in series with the collector of the respective amplifying transistors.

5. The hand held testing device as recited in claim 1, in which the amplifying circuits each comprise an operational amplifier having a non-inverting input connected to the respective connector tap of the voltage divider, having an inverting input, and having an output connected to said inverting input; and a diode connected to the output of the operational amplifier wherein said diode is connected in series to respective diodes of the adjacent display stages, therewith performing the inter-connection of said display stages.

6. The hand held testing device as recited in claim 5, in which the diode of the amplifying circuit is constructed of a light emitting diode, whereby said diode simultaneously forms the optical display element of the respective display stage.

7. The hand held testing device as recited in claim 5, in which the optical display element in each display stage being constructed of a light emitting diode, is connected between the output and the inverting input of the operational amplifier.

8. The hand held testing device as recited in claim 1 in which the common voltage supply for the display stages further comprises a d-c voltage source with a positive and a negative connector; and a constant current source connected to the voltage source.

9. The hand held testing device as recited in claim 8, in which the constant current source comprises
    (a) a further transistor having a collector connected to the series connection of said diodes of said amplifying circuits, a base connected to ground and an emitter;
    (b) an emitter resistor connected to the emitter of said further transistor and to the negative connector tap of said d-c voltage source;
    (c) a base resistor connected to the base of said transistor and to the positive connector tap of said d-c voltage source; and
    (d) a zener diode inserted between the base of said transistor and the negative connector tap of the d-c voltage source.

10. A hand held testing device as recited in claim 9, in which the common voltage supply comprises a separate battery.

11. The hand held testing device as recited in any one of the claims 1–10, further comprising
    (a) a rectifier bridge arranged between said connecting point and voltage divider, constructed of semiconductor diodes in two branches and having two inputs for receiving the test voltage and two outputs, each output being a center tap of a respective branch of the rectifier bridge;
    (b) one center tap of said rectifier bridge connected to ground, the other center tap connected to an input connector tap of the voltage divider associated to the input connecting point; and
    (c) two additional display elements constructed of light emitting diodes, each display element connected in series to one semiconductor diode of a respective branch of the rectifier bridge, whereby said display elements in addition to the operation of the display elements of the plurality of display stages indicate the existence of a received a-c test voltage if simultaneously in operable condition or the polarity of a received d-c test voltage.

12. The hand held testing device as recited in claim 11 further comprising
   (a) a protective circuit connected to the ungrounded center tap of the rectifier bridge, having
      (1) an ohmic resistor and a ceramic resistor with positive temperature coefficient connected in series; and
      (2) another ohmic resistor connected in parallel to said series connection of the ohmic resistor and the ceramic resistor; and
   (b) two transistors forming an input stage and an output stage and interconnected in a Darlington configuration having a common collector resistor, wherein the input stage is connected to the input connector tap of the voltage divider the and the output stage is connected between the protective circuit and a connector tap of the voltage divider associated with the ground connection.

13. The hand held testing device as recited in claim 12, the voltage supply for the display stages further comprising
   (a) a transistor having a base, an emitter and a further collector and forming a constant current source; the base of said transistor connected to a base resistor which is, in turn, connected to the connector tap of the voltage divider associated with the ground connection; the emitter connected to a resistor which is, in turn, connected to ground; and the collector connected to the series connection light emitting diodes; and
   (b) another diode connected to the connector tap of the voltage divider associated with the ground connection, said diode, in turn, being connected to ground, whereby this diode forms a constant voltage source for regulation of the constant current source.

14. The hand held testing device as recited in claim 13, wherein the diode forming the constant voltage source is constructed of a light emitting diode to form a display element of a lowermost display stage for indicating a lowest test voltage level.

15. The hand held testing device as recited in claim 13, wherein the display stages with light emitting diodes form a first display section for indicating low test voltage levels, further comprising:
   (a) a circuit of two display elements for indicating polarity of a test voltage connected in anti-parallel, said circuit connected to the input connecting point;
   (b) a second display section for indicating higher test voltage levels having:
      (1) glow discharge lamps connected in series via respective connector taps;
      (2) a series connection of ohmic resistors connected in parallel to said glow discharge lamps, such that the ohmic resistors form a second voltage divider for the respective glow discharge lamps;
      (3) a further ceramic resistor with a positive temperature coefficient connected in parallel to said network of glow discharge lamps and resistors;
      said second display section being connected to the output of the circuit of display elements indicating polarity and, in turn, to the second connecting point for receiving the test voltage.

* * * * *